(12) United States Patent
Maruyama et al.

(10) Patent No.: US 8,614,536 B2
(45) Date of Patent: Dec. 24, 2013

(54) PIEZOELECTRIC ELEMENT, AND PIEZOELECTRIC ACTUATOR AND VIBRATION WAVE MOTOR INCLUDING PIEZOELECTRIC ELEMENT

(75) Inventors: Yutaka Maruyama, Tokyo (JP); Akira Shimada, Kawasaki (JP); Yutaka Inada, Sendai (JP); Masashi Matsumoto, Kumagaya (JP); Yuu Itou, Sendai (JP)

(73) Assignees: Canon Kabushiki Kaisha, Tokyo (JP); Taiheiyo Cement Corporation, Tokyo (JP); Nihon Ceratec Co., Ltd., Sendai-shi (JP)

(*) Notice: Subject to any disclaimer, the term of this patent is extended or adjusted under 35 U.S.C. 154(b) by 21 days.

(21) Appl. No.: 13/408,564

(22) Filed: Feb. 29, 2012

(65) Prior Publication Data
US 2012/0228998 A1    Sep. 13, 2012

(30) Foreign Application Priority Data
Mar. 10, 2011    (JP) .................................. 2011-052510

(51) Int. Cl.
*H01L 41/08*    (2006.01)
(52) U.S. Cl.
USPC .................. 310/323.12; 310/323.16; 310/328

(58) Field of Classification Search
USPC .................. 310/323.02, 323.12, 323.16, 328, 310/357–359
See application file for complete search history.

(56) References Cited

U.S. PATENT DOCUMENTS

| 5,770,916 A * | 6/1998 | Ezaki et al. ................... 310/366 |
| 5,798,052 A | 8/1998 | Ando et al. |
| 5,814,919 A * | 9/1998 | Okumura .................. 310/323.12 |
| 6,404,104 B1 * | 6/2002 | Maeno et al. ............. 310/323.02 |
| 6,559,574 B2 * | 5/2003 | Maruyama ............... 310/323.02 |

FOREIGN PATENT DOCUMENTS

| JP | 5-105511 A | 4/1993 |
| JP | 2001-267646 A | 9/2001 |
| JP | 2003-111450 A | 4/2003 |

* cited by examiner

*Primary Examiner* — Mark Budd
(74) *Attorney, Agent, or Firm* — Fitzpatrick, Cella, Harper & Scinto

(57) ABSTRACT

Provided is a piezoelectric element including: an electrode portion including a piezoelectric layer and an electrode layer that are laminated; and a non-electrode portion that is in contact with the electrode portion and includes a piezoelectric layer without an electrode layer, in which the non-electrode portion includes a region having a density smaller than a density of the piezoelectric layer of the electrode portion.

8 Claims, 8 Drawing Sheets

PIEZOELECTRIC ELEMENT, AND PIEZOELECTRIC ACTUATOR AND VIBRATION WAVE MOTOR INCLUDING PIEZOELECTRIC ELEMENT

BACKGROUND OF THE INVENTION

1. Field of the Invention

The present invention relates to a piezoelectric element having an electromechanical energy conversion function, in which piezoelectric layers and electrode layers are laminated, and more particularly, to a piezoelectric element suitable for a vibration wave motor and a piezoelectric actuator, and to a piezoelectric actuator and a vibration wave motor which include the piezoelectric element.

2. Description of the Related Art

A piezoelectric material is a typical material having an electromechanical energy conversion function for converting electrical energy into mechanical energy.

Owing to its characteristics, a piezoelectric element made of a piezoelectric material is used in various piezoelectric actuators such as a vibration wave motor.

In particular, in recent years, not only a single plate piezoelectric element but also laminated piezoelectric elements are used, such as an element in which multiple piezoelectric layers and electrode layers are laminated alternately to be multilayered and baked integrally, and an element in which piezoelectric elements baked into single plates are laminated and bonded.

This is because the laminated structure can obtain a larger displacement or a larger force with a low voltage than a single plate piezoelectric element. In particular, the integrally baked laminated piezoelectric element is suitable for reduction in size and thickness.

Conventionally, as to a vibration wave motor as an oscillatory wave driving device, there are many proposals about the laminated piezoelectric element constituting a part of a vibration body of a rod-like vibration wave motor. This laminated piezoelectric element includes multiple piezoelectric layers made of a piezoelectric material and electrode layers (referred to also as internal electrodes) made of an electrode material and disposed on the surfaces of the piezoelectric layers.

For instance, U.S. Pat. No. 5,770,916 discloses a laminated piezoelectric element as illustrated in FIG. 9 as a laminated piezoelectric element used for a vibration body of a rod-like vibration wave motor.

Multiple electrode layers 43 are disposed on the surfaces of multiple piezoelectric layers 42 except the uppermost layer constituting a laminated piezoelectric element 40.

The electrode layer 43 is divided into four regions (in FIG. 9, eight types of A+, A−, B+, B−, AG+, AG−, BG+, and BG− are illustrated).

Further, connection electrodes 43a (part filled with black color in FIG. 9) are formed to be connected to the electrode layers 43 and extend to outer edge portions of the piezoelectric layers 42.

The connection electrodes 43a are connected to external electrodes 44 disposed on the outer peripheral portion of the laminated piezoelectric element 40 for electrical connection among layers.

Multiple surface electrodes 45 are disposed on the surface of the uppermost piezoelectric layer 42 constituting the laminated piezoelectric element 40 and are each formed corresponding to a position of the connection electrode 43a so as to be connected to the external electrode 44.

Polarization is performed by applying DC voltages via the surface electrodes 45 to A+, A−, B+, and B− of the electrode layers 43 so that A+ and B+ become positive while A− and B− become negative with respect to AG+, AG−, BG+, and BG− that are the ground. Thus, the polarities for driving the vibration wave motor can be obtained.

Further, FIG. 10 is a cross sectional view illustrating an example in which the laminated piezoelectric element 40 of FIG. 9 is incorporated in a vibration body 51 of a rod-like vibration wave motor 50.

In FIG. 10, the laminated piezoelectric element is interposed between hollow metal members 53 and 54 constituting the vibration body 51 together with a flexible circuit board 52 and is fastened by a bolt 55.

On one side of the vibration body 51 in the axial direction, there is disposed a rotor 58 that is pressed by a spring 56 and a spring support 57 to contact with a distal end portion of the metal member 54, and hence a rotation output can be obtained from a rotating gear 59.

As a method of driving the rod-like vibration wave motor 50, AC voltages having different temporal phases by approximately $\pi/2$ are applied to Phase A constituted of A+, A−, AG+, and AG− and to Phase B constituted of B+, B−, BG+, and BG− of the laminated piezoelectric element 40 incorporated in the vibration body 51.

As a result, two bending vibrations orthogonal to the axial direction are excited instead of rotating wobbling motion. Then, using the distal end portion of the metal member 54 constituting the vibration body 51 as a frictional surface, the rotor 58 that is pressed to contact with the metal member 54 rotates by the friction contact.

As described above in the conventional example, the polarization is performed in which DC voltages are applied to A+, A−, B+, and B− so that A+ and B+ become positive while A− and B− become negative with respect to AG+, AG−, BG+, and BG− that are the ground. In this case, there is a known problem that a non-electrode portion 46 made of the piezoelectric layer between two neighboring electrode portions to which DC voltages having opposite polarities (positive and negative) are applied as illustrated in FIG. 9 causes a potential difference and is polarized in the polarization.

Herein, the region in which the piezoelectric layer 42 and the electrode layer 43 are overlaid (the region in which the electrode layer is formed on the piezoelectric layer) is referred to as the electrode portion, while the region having only the piezoelectric layer 42 without the electrode layer (the region of the piezoelectric layer in which the electrode layer is not formed) is referred to as the non-electrode portion.

When the non-electrode portion is polarized, the Young's modulus as a mechanical property of the non-electrode portion is changed by the polarization, and there occurs a difference in Young's modulus between the polarized non-electrode portion 46 and an unpolarized non-electrode portion 47. As a result, the piezoelectric layer having the non-electrode portion 46 and the non-electrode portion 47 has locally different Young's modulus values. Further, the non-electrode portion 46 and the non-electrode portion 47 have a positional relationship in which they pass a center axis and are orthogonal to each other with respect to the piezoelectric layer. For instance, supposing the non-electrode portion 46 is the X axis, the non-electrode portion 47 becomes the Y axis, and the X axis and the Y axis are orthogonal to each other. In this way, if there are regions having different Young's modulus values in the X axis direction and in the Y axis direction, the difference in Young's modulus between the non-electrode portion 46 and the non-electrode portion 47 causes anisotropy (uneven stiffness) of the mechanical property (flexural stiffness)

in the vibration body 51 incorporating the laminated piezoelectric element 40, resulting in uneven vibration amplitude or phase.

This influence may cause deterioration of controllability and rotational position accuracy, and cause rotational unevenness, and further hinder even friction in the rod-like vibration wave motor of the conventional example.

Therefore, in Japanese Patent Application Laid-Open No. 2003-111450, it is devised to increase a width of the non-electrode portion (distance between the electrode portions).

There is another problem that the laminated piezoelectric element is expensive. The piezoelectric material is usually baked at a relatively high temperature of approximately 1,200° C. in the case of a single plate. Then, silver paste containing glass frit is applied after the baking, and baked at a temperature of 600 to 850° C. to obtain the piezoelectric element. In this way, the baking condition is different between the piezoelectric material and the electrode material in accordance with the characteristics of the material.

On the other hand, in the laminated piezoelectric element, the piezoelectric material and the electrode are baked together, and hence it is necessary to consider the baking condition for a metal material of the electrode. As a result, as the electrode material, it is necessary to use precious metal (such as silver-palladium alloy or rarely platinum), which has a high melting point so as not to be melted at the baking temperature and which is not oxidized or hardly oxidized by baking.

Conventionally, the laminated piezoelectric element is baked using an electrode material containing silver at 70 wt % and palladium at 30 wt %, for example, at a lowered baking temperature of 1,150° C. in view of a composition of the piezoelectric material or the use of fine powder grains.

Palladium and platinum as precious metal are particularly expensive, and hence have a high cost ratio in the total cost of the electrode material, which is responsible for high cost.

Therefore, development of piezoelectric materials that can be baked at low temperature has been carried out actively, and there are many proposals for lowering the baking temperature by adding copper or other element so that low temperature baking can be performed (see U.S. Pat. No. 5,798,052).

As described above, in the vibration wave motor using the laminated piezoelectric element for the vibration body, in order to suppress the rotational unevenness or the like, it is required to reduce as much as possible the anisotropy of mechanical property due to the difference in Young's modulus generated by polarization of the non-electrode portion between two electrode portions having different polarities.

Therefore, the increase in width of the non-electrode portion as described in Japanese Patent Application Laid-Open No. 2003-111450 does not always lead to a satisfactory output of the piezoelectric element.

In addition, there is a proposal for enabling the low temperature baking of the laminated piezoelectric element as described in U.S. Pat. No. 5,798,052 and the like. However, it is desired to lower the baking temperature as much as possible while maintaining piezoelectric characteristics, so as to obtain a laminated piezoelectric element that can be manufactured at a lower baking temperature and can provide good piezoelectric characteristics.

SUMMARY OF THE INVENTION

In view of the above-mentioned problem, an object of the present invention is to provide a piezoelectric element, which can obtain more preferred mechanical property of a non-electrode portion of the piezoelectric element used for a vibration wave motor, and can be manufactured at lower cost, and also provide a piezoelectric actuator and a vibration wave motor that include the piezoelectric element.

A piezoelectric element according to the present invention includes: an electrode portion including a piezoelectric layer and an electrode layer that are laminated; and a non-electrode portion that is in contact with the electrode portion and includes a piezoelectric layer without an electrode layer, in which the non-electrode portion includes a region having a density smaller than a density of the piezoelectric layer of the electrode portion.

Further, a piezoelectric actuator according to the present invention includes the above-mentioned piezoelectric element.

Further, a vibration wave motor according to the present invention includes: the above-mentioned piezoelectric element; and a vibration body, in which the piezoelectric element drives the vibration body.

According to the present invention, there can be obtained the piezoelectric element, which can obtain more preferred mechanical property of the non-electrode portion of the piezoelectric element used for a vibration wave motor, and can be manufactured at lower cost, and also the piezoelectric actuator and the vibration wave motor that include the piezoelectric element.

Further features of the present invention will become apparent from the following description of exemplary embodiments with reference to the attached drawings.

DESCRIPTION OF THE EMBODIMENTS

Figure 1:
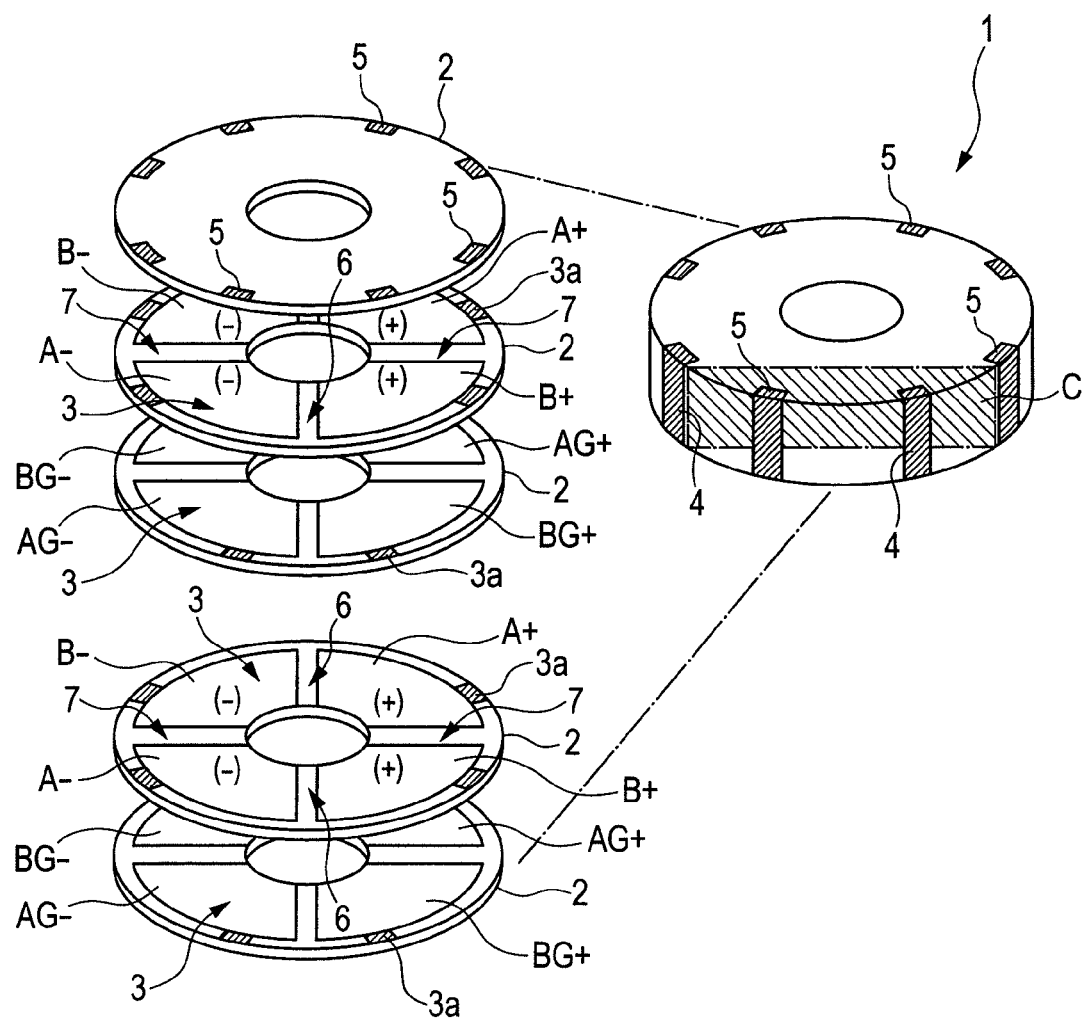
FIG. 1 is an exploded perspective view and a perspective view of a structure of a laminated piezoelectric element according to Example 1 of the present invention.

A piezoelectric element according to the present invention includes: an electrode portion including a piezoelectric layer and an electrode layer that are laminated; and a non-electrode portion that is in contact with the electrode portion and includes a piezoelectric layer without an electrode layer, in which the non-electrode portion includes a region having a density smaller than a density of the piezoelectric layer of the electrode portion. In the present invention, the piezoelectric element may be a single layer type piezoelectric element (combination of one piezoelectric layer and two electrode layers) or a laminated type piezoelectric element (in which multiple piezoelectric layers and multiple electrode layers are laminated alternately).

In the present invention, the ratio of density of the non-electrode portion to the electrode portion is preferably 94% or more to 97% or less, and optimally 95% or more to 96% or less.

If the density of the non-electrode portion becomes 94% or less than the density of the electrode portion, the vibration characteristic or mechanical strength is lowered. If the density of the non-electrode portion becomes 97% or more, the effect of the present invention is decreased.

The present invention is based on the discovery that when the piezoelectric layer is polarized, the Young's modulus is changed and on the discovery that there is correlation between the density of the piezoelectric layer and the change of the Young's modulus depending on the polarization method.

Further, by positively providing a region having different density in a specific region of the piezoelectric layer, the anisotropy (uneven stiffness) of the mechanical property (flexural stiffness) is effectively suppressed.

In other words, the anisotropy (uneven stiffness) of the mechanical property (flexural stiffness) is effectively suppressed by adjusting the Young's modulus of the non-electrode portion to be uniform or by reducing the difference in Young's modulus.

In addition, according to the present invention, a specific element (typically copper element) having a function as a sintering additive is contained in the piezoelectric material. Thus, when baking is performed in the baking condition of the present invention, a sintered body having locally different densities can be obtained. In other words, density distribution of the piezoelectric material can be controlled.

This is based on the discovery by the inventors of the present invention that the relationship between the baking temperature and the density can be controlled by containing the specific element (typically copper element) having a function as a sintering additive in the piezoelectric material. Then, the piezoelectric material can be easily formed under a fixed baking condition to have regions having locally different densities.

In addition, in the present invention, in order to contain a sintering additive or a silver element in a necessary portion of the piezoelectric layer, it is possible to contain the element when the piezoelectric layer is formed, or to contain the element through the application onto the surface of the piezoelectric layer or by ion implantation after the piezoelectric layer is formed.

In addition, it is possible to add the silver element to the electrode layer and to disperse the silver element from the electrode layer to the piezoelectric layer by thermal treatment or the like so that the silver element is contained.

In the present invention, sintering means a phenomenon in which grains of the piezoelectric material are baked and fastened to be connected to each other at a temperature of melting point or lower.

In the present invention, baking temperature means a temperature of heat treatment of the piezoelectric material, and the piezoelectric material is sintered by adjusting the heat treatment temperature.

Examples of the present invention are described below, but the present invention is not limited by those examples.

EXAMPLE 1

An example of a structure of the piezoelectric element to which the present invention is applied is described with reference to FIG. 1.

The present invention is different from the conventional example in composition of the piezoelectric material described later, manufacturing method therefor, and baking temperature. In addition, a mixing ratio of silver and palladium of the electrode material is also different.

Note that, in the following description, the baking temperature means the highest baking temperature in the baking process.

In FIG. 1, multiple electrode layers 3 are disposed on the surfaces of multiple piezoelectric layers 2 constituting a laminated piezoelectric element 1.

The electrode layer 3 is disposed so that its outer periphery is inside of the outer periphery of the piezoelectric layer 2 and is divided into four regions on the piezoelectric layer 2 (in FIG. 1, eight types of A+, A−, B+, B−, AG+, AG−, BG+, and BG− are illustrated).

The electrode layers 3 formed on the same layer are not electrically connected to each other.

Further, on the surface of the piezoelectric layer 2, there are formed connection electrodes 3a (parts filled with black color in FIG. 1) that are connected to the electrode layers 3 and extend to outer edge portions of the piezoelectric layer 2.

The connection electrodes 3a are formed to have the same positional relationship in the axial direction and in the circumferential direction of the laminated piezoelectric element 1 every other layer of the piezoelectric layer 2 with respect to the eight types of the electrode layers 3. The connection electrodes 3a at the same position are connected to each other via an external electrode 4 that is an electrode disposed on the outer peripheral portion of the laminated piezoelectric element 1 for electrical connection among layers (eight external electrodes 4 corresponding to A+, A−, B+, B−, AG+, AG−, BG+, and BG− in FIG. 1).

Multiple surface electrodes 5 are provided at the outer peripheral portion of the surface of the uppermost piezoelectric layer constituting the laminated piezoelectric element 1 along the circumferential direction. The surface electrodes 5 are disposed corresponding to positions of the connection electrodes 3a and are connected to the external electrodes 4. The external electrodes 4 are disposed for electrical connection among electrode layers.

Then, positive and negative DC voltages are applied to A+, A−, B+, and B− of the electrode layers 3 via the surface electrodes 5 with respect to AG+, AG−, BG+, and BG− that are the ground. Thus, polarization is performed so as to enable driving of the vibration wave motor described later.

The polarization is performed in the condition described later through the application of DC voltages via the surface electrodes 5 to A+, A−, B+, and B− of the electrode layers 3 so that A+ and B+ become positive while A− and B− become negative with respect to AG+, AG−, BG+, and BG− that are the ground.

In other words, with respect to AG+, AG−, BG+, and BG− that are the ground, A+ becomes the polarity (+), A− becomes the polarity (−), B+ becomes the polarity (+), and B− becomes the polarity (−).

Figure 2:
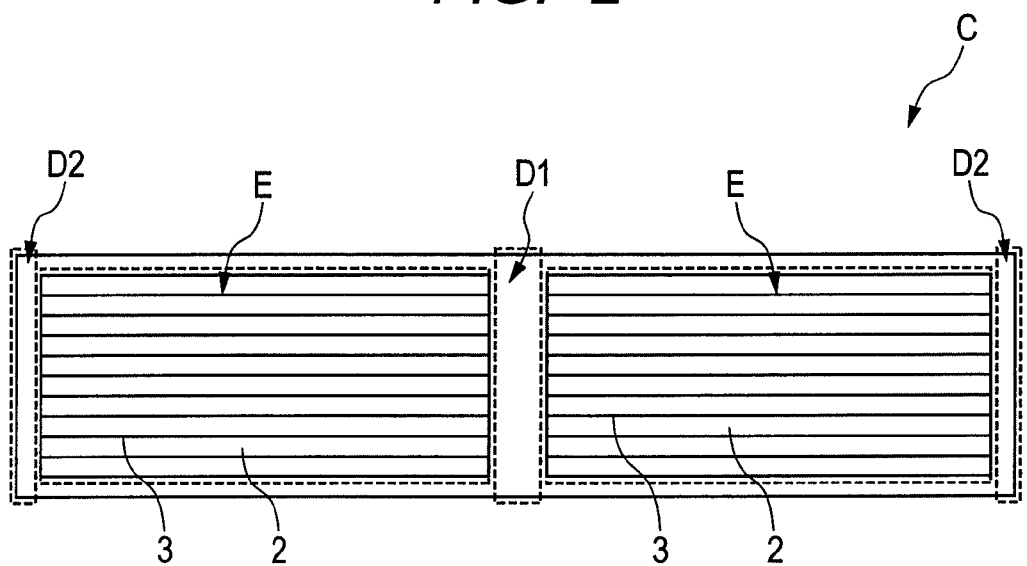
FIG. 2 is a diagram illustrating an electrode portion and a non-electrode portion of the laminated piezoelectric element according to Example 1 of the present invention.

FIG. 2 is a diagram illustrating a cross section C indicated by hatching in FIG. 1, and illustrates electrode portions E and non-electrode portions D.

FIG. 2 illustrates electrode portions E (regions surrounded by the broken line) in which the piezoelectric layers 2 and the electrode layers 3 are laminated alternately, a non-electrode portion D1 (region surrounded by the broken line) which is interposed between the electrode portions E and constituted by only the piezoelectric layer 2, and a non-electrode portion D2 (region surrounded by the broken line) which is disposed on the outer peripheral portion and constituted by only the piezoelectric layer without the electrode layer.

The non-electrode portion D1 corresponds to the cross section of a non-electrode portion 6 in FIG. 1. Note that, in FIG. 1, a non-electrode portion 7 is the unpolarized non-electrode portion.

Figure 3:
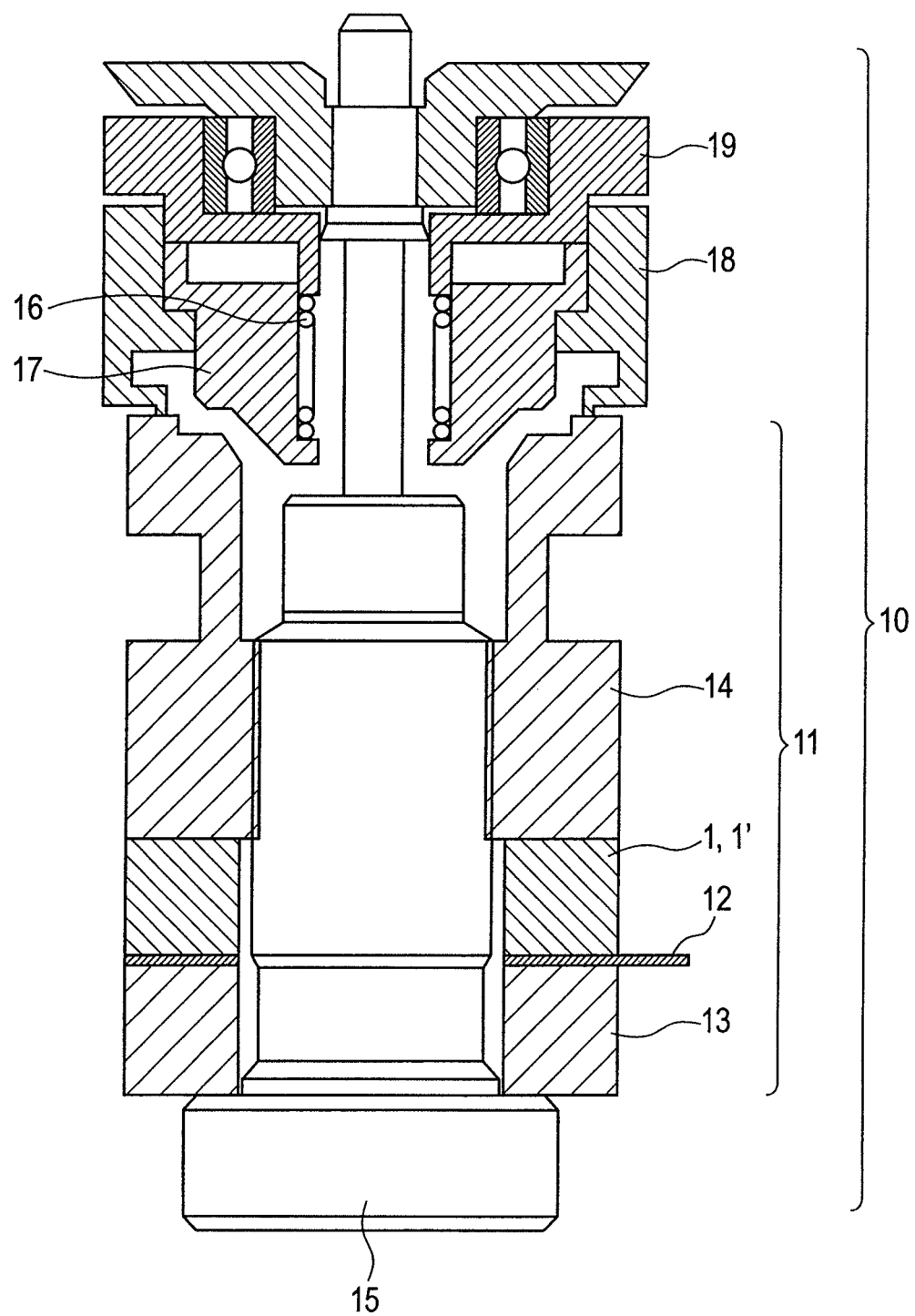
FIG. 3 is a diagram illustrating a structure of a vibration wave motor in which the laminated piezoelectric element according to Example 1 of the present invention is incorporated.

Further, FIG. 3 is a cross sectional view illustrating an example of the laminated type piezoelectric actuator having a structure in which the laminated piezoelectric element 1 of FIG. 1 is incorporated in a vibration body 11 of a rod-like vibration wave motor 10.

In FIG. 3, the laminated piezoelectric element 1 having a through hole in the middle portion is disposed between hollow metal members 13 and 14 constituting the vibration body 11 so that the surface electrodes 5 contact with a flexible circuit board 12.

A bolt 15 is inserted from the metal member 13 side and is screwed into the metal member 14. Thus, the laminated piezoelectric element 1 and the flexible circuit board 12 are interposed and fixed between the metal member 13 and the metal member 14.

On one side of the vibration body 11 in the axial direction, there is disposed a rotor 18 that is pressed by a spring 16 and a spring support 17 to contact with a distal end portion of the metal member 14. Thus, a rotation output of the vibration wave motor 10 can be obtained from a gear 19 which rotates integrally with the rotor 18.

The flexible circuit board 12 is connected to the surface electrode 5 that is connected to the external electrode 4 of the laminated piezoelectric element 1, and to a driving circuit (not shown), and an AC voltage for driving is applied to the laminated piezoelectric element 1.

The drive principle of the rod-like vibration wave motor 10 is as follows. AC voltages having different temporal phases by approximately $\pi/2$ and having a frequency close to a resonance frequency of the vibration body 11 are applied to Phase A constituted of A+, A−, AG+, and AG− and to Phase B constituted of B+, B−, BG+, and BG− of the laminated piezoelectric element 1 incorporated in the vibration body 11.

Thus, two bending vibrations of Phase A and Phase B orthogonal to the axial direction can be excited instead of rotating wobbling motion.

As a result, using the distal end portion of the metal member 14 constituting the vibration body 11 as a frictional surface, the metal member 14 performs the wobbling motion. Then, the rotor 18, which is a contact member to be pressed to contact with the metal member 14, rotates by the friction contact.

Next, a method of manufacturing the laminated piezoelectric element according to this example is described.

First, as described in Japanese Patent Application Laid-Open No. H05-105511, as the piezoelectric materials, powder raw materials of $Pb_3O_4$, $SrCO_3$, $ZrO_2$, $TiO_2$, and $Nb_2O_5$ were mixed at a molar ratio of Pb:Sr:Zr:Ti:Nb=0.95:0.08:0.51:0.49:0.03 as a composition ratio.

Then, the powder raw materials were mixed together with pure water in a ball mill for 5 hours and were dried at 110° C. Then, the resultant was calcined at 950° C. in the air for 2 hours so that raw material powder (calcined powder) having a perovskite phase crystal structure was prepared. Then, $MnCO_3$ was added to this raw material powder (calcined powder) in amount of 0.015 (molar ratio in the case where Zr+Ti=1 holds), followed by mixing similarly together with pure water and drying.

Then, in this example, copper oxide (CuO) was added as a low temperature sintering additive to the piezoelectric materials at 0.5 wt %.

Further, using a general powder mixer and grinder, the piezoelectric materials were mixed together with pure water to be dispersed uniformly to have a small average grain diameter of approximately 0.4 to 0.5 μm, and were dried at 110° C.

In this case, if the addition amount of copper oxide is small, the effect is small, while if the addition amount is large, the insulation resistance becomes so small that the polarization becomes difficult. Therefore, it is preferred that the addition amount be 0.2 to 0.8 wt %.

Note that, as described in U.S. Pat. No. 5,798,052, an element other than a copper element, for example, tungsten or zinc may be added as necessary as the low temperature sintering additive.

Before manufacturing the laminated piezoelectric element 1 of this example, test pieces were prepared, and the baking condition was studied.

Figure 4A:
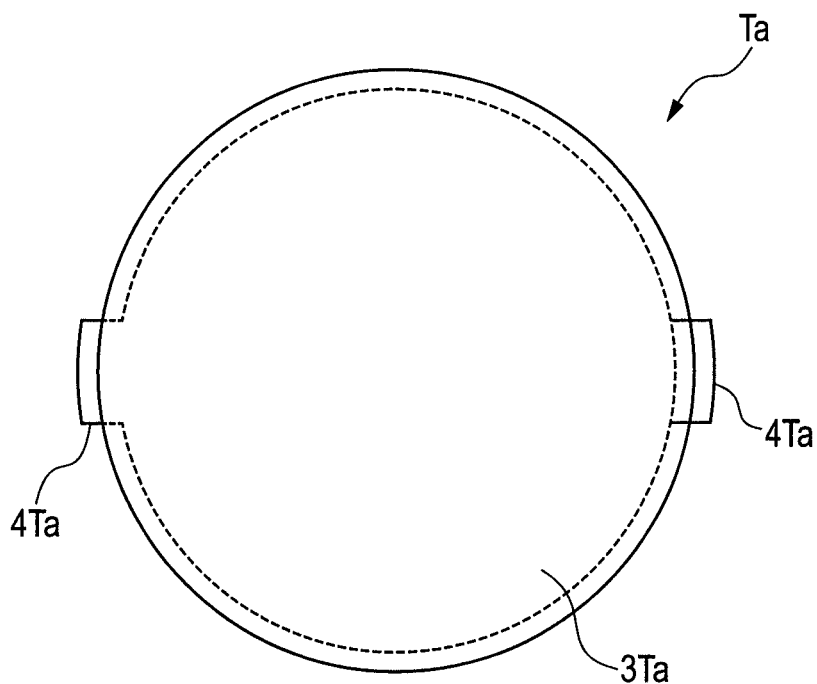
FIGS. 4A and 4B are diagrams illustrating a test piece for measuring characteristics according to the present invention.
Figure 4B:
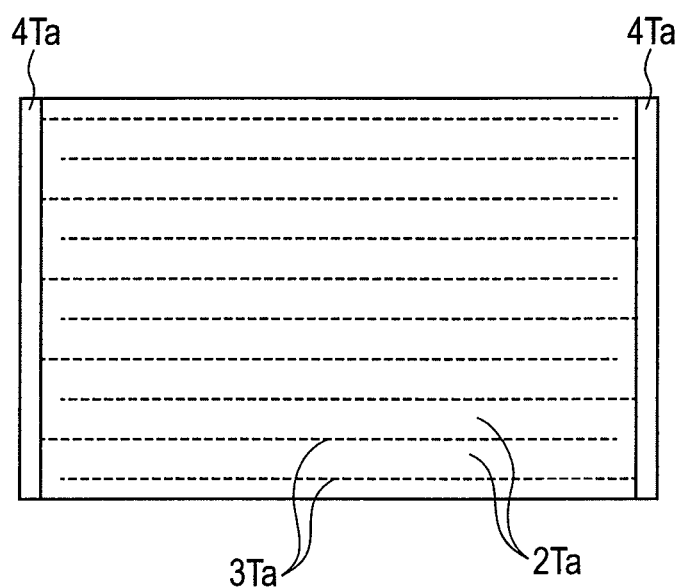

The following two types of test pieces were prepared. A first test piece Ta is a test piece supposing the laminated electrode portion, which has a disk shape with an outer diameter of 15 mm and a thickness of approximately 0.9 mm as illustrated in FIGS. 4A and 4B.

Piezoelectric layers 2Ta have a thickness of 90 μm each and a nine-layered structure, and there are formed electrode layers 3Ta having a thickness of approximately 2 to 3 μm each and an outer diameter of 14.8 mm to occupy almost the entire surface of the piezoelectric layer 2Ta. Then, the electrode layers 3Ta are connected electrically by two external electrodes 4Ta via connection electrodes at every other layer. Note that, the uppermost layer and the lowermost layer on both sides of the test piece Ta are piezoelectric layers having a thickness of approximately 45 μm each, which function as insulating layers.

In addition, an electrode material forming the electrode layer 3Ta contained silver at 95 wt % and palladium at 5 wt %. After baking, the external electrode 4Ta was formed by applying silver paste with glass frit and baking the resultant at approximately 750° C.

A second test piece Tb is a test piece supposing the non-electrode portion, which has a disk shape formed by laminating ten layers of piezoelectric sheets having a thickness of approximately 90 μm each after baking without electrode layers.

Both the test pieces include the piezoelectric layers made of the same material (material and sintering additive), and are different in presence or absence of the electrode layers and in the number of layers.

Those test pieces were baked and the densities thereof were measured by an Archimedean method. Then, the polarization was performed on the test piece Ta by applying a voltage of 300 V across the two external electrodes 4Ta, one of which was the ground, in oil at a temperature of 120° C. for 30 minutes.

The resonance frequency and an antiresonance frequency were measured by an impedance analyzer so as to determine an electromechanical coupling coefficient kr of radial vibration of the disk as one of the piezoelectric characteristics. The baking temperature was varied from 860° C. to 960° C., and the baking temperature was kept for 2 hours.

Figure 5:
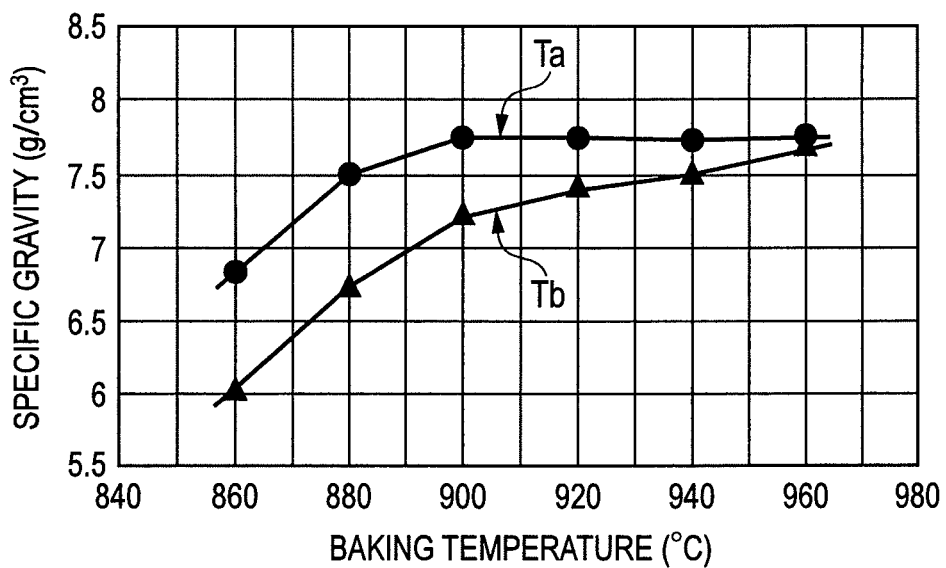
FIG. 5 is a graph illustrating a relationship between baking temperature and density according to the present invention.

In FIG. 5, the horizontal axis represents the baking temperature while the vertical axis represents the density. As the baking temperature rises, the density increases. The density increases more rapidly to promote densification in the test piece Ta supposing the electrode portion, and the density becomes 7.75 g/cm³ to be substantially saturated at a baking temperature of 900° C. or higher. Therefore, it is considered that the densification is completed at this temperature.

On the other hand, in the test piece Tb supposing the non-electrode portion, the density increases slowly, and the density value is not saturated until the temperature becomes 960° C. Therefore, it is considered that the densification is not completed at a temperature of 940° C. In addition, the density of the test piece Tb supposing the non-electrode portion baked at 940° C. is 7.5 g/cm³. The density of the test piece Tb baked at 940° C. or lower corresponds to that of a densified test piece Ta supposing the electrode portion and is 97% or lower of a density of 7.75 g/cm³. Note that, both the electrode portion and the non-electrode portion are densified so that the sintering is completed at a baking temperature of 960° C. or higher. Therefore, in the case of the piezoelectric element in which both the electrode portion and the non-electrode portion having the structures of the test pieces of this example coexist, the non-electrode portion can be made locally to have a low density by baking at 940° C. However, the above-mentioned baking temperature of 940° C. varies also depending on a composition of the piezoelectric material, the temperature rise time, the type and quantity of the sintering additive to be added, or the like. Therefore, it is preferred to grasp a relationship between temperature and a sintered state in advance by a preliminary experiment or the like so as to determine the baking temperature.

Figure 6:
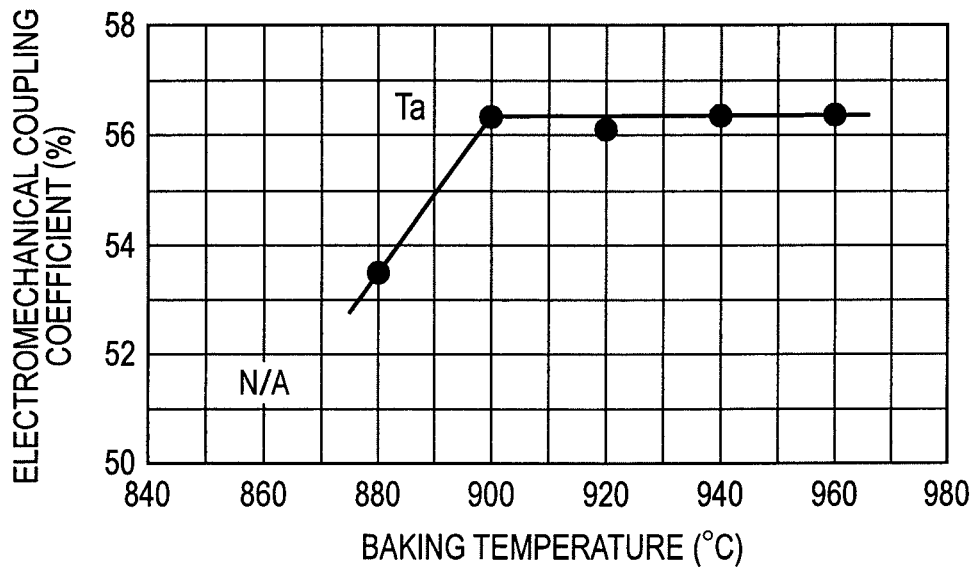
FIG. 6 is a graph illustrating a relationship between baking temperature and electromechanical coupling coefficient according to the present invention.

In addition, as illustrated in FIG. 6, the electromechanical coupling coefficient kr of the test piece Ta supposing the electrode portion was measured.

In FIG. 6, the horizontal axis represents the baking temperature while the vertical axis represents the electromechanical coupling coefficient kr. When the baking temperature becomes 900° C. or higher, characteristics of the electrode portion substantially reach 56.4% of the electromechanical coupling coefficient kr of the original piezoelectric characteristics.

In this way, by adding the low temperature sintering additive, the baking temperature can be decreased to be lower than the conventional baking temperature.

It is considered that sintering of the electrode portion proceeds rapidly because of the effect of adding the low temperature sintering additive and because the silver element in the electrode layer is dispersed into the piezoelectric layer so as to promote the sintering.

Similarly to the low temperature sintering additive, the silver also migrates as liquid phase into a crystal grain boundary of the piezoelectric ceramics and promotes the sintering at low temperature as a sintering additive. As a result, the region in which the silver element is dispersed in the electrode layer (region corresponding to the electrode portion) is sintered at a lower temperature to have higher density than the region in which the silver element is not dispersed (corresponding to the non-electrode portion).

The laminated piezoelectric element 1 was manufactured as follows. Using the above-mentioned piezoelectric material and an organic binder, green sheets to be the piezoelectric layers were prepared by a doctor blade method. On this green sheet at a predetermined position, the electrode layer 3 and the connection electrode 3a were formed by screen printing using paste of the electrode material. The electrode material was prepared to contain silver at 95 wt % and palladium at 5 wt %.

The electrode material paste was prepared by adding the piezoelectric material powder to the electrode material powder and kneading an organic vehicle using an organic binder and an organic solvent by a three-roll mill.

Then, a predetermined number of the green sheets were stacked in a plane and pressed to be laminated. After that, the piezoelectric layer and the electrode layer were integrally baked by simultaneous baking, and the polarization was performed. The baking temperature was set to 900 to 940° C., and the baking temperature was kept for 2 hours in accordance with the mass production condition.

Then, lapping was performed on both sides, and the outer diameter was finished by grinding.

The laminated piezoelectric element 1 of this example had an outer diameter of approximately 10 mm, an inner diameter of approximately 2.8 mm, and a thickness of 2.4 mm. The piezoelectric layer 2 had a thickness of approximately 90 μm, and the number of piezoelectric layers 2 was twenty-four.

The electrode layer 3 had a thickness of approximately 2 to 3 μm, and the number of electrode layers 3 was twenty-five. In addition, the outer diameter of the electrode layer 3 was 9 mm. In addition, an inactive layer called a protection layer was disposed on each of the upper and lower sides of the twenty-four piezoelectric layers.

Note that, the width of the non-electrode portion D1 dividing the electrode layer 3 into four regions was set to 0.5 mm. The width of the non-electrode portion D2 at the outer periphery was set to 0.5 mm.

After the process, the external electrodes 4 and the surface electrodes 5 were formed by printing silver electrode paste containing glass frit by screen printing, followed by baking at approximately 750° C.

The polarization was performed as follows on A+, A−, B+, and B− of the electrode layer 3 via the surface electrodes 5 with respect to AG+, AG−, BG+, and BG− that are the ground.

Specifically, +300 V and −300 V as DC voltages were applied in oil at 120° C. for 30 minutes to perform the polarization so as to enable driving of the vibration wave motor.

In this case, from observation of the cross section of the laminated piezoelectric element 1 after baking, it was found that the electrode portion E and the non-electrode portions D1 and D2 have different color tones, and that the electrode portion E after sufficient densification had changed to a black color.

In contrast, it was observed that the non-electrode portion D1 between two electrode portions E and the non-electrode portion D2 at the outer peripheral portion were brown color or dark brown color and were not sufficiently densified unlike the black color of the electrode portion E.

In the present invention, "sufficient densification" means that when density variation of the sintered body is measured while changing the baking temperature, the density is not changed at all or the changing rate is small so that the density is considered to be saturated when the baking temperature is raised.

In addition, if the baking temperature is raised excessively beyond an appropriate temperature, the density may be lowered. Further, at the same time, the electromechanical coupling coefficient kr as piezoelectric characteristics described above may be lowered. Based on this relationship, it is possible to check the relationship between the baking temperature and the density of the test piece (sample) of the piezoelectric layer, and to determine that the baking temperature is too high if the density starts to decrease while the baking temperature is being raised.

In the present invention, when the baking temperature is raised, if the density variation is 0.2% or less, it is determined that the "sufficient densification" has occurred. In addition, in the present invention, it is preferred to measure the density by an Archimedean method.

In the present invention, it is important to determine the baking temperature so that the electrode portion is sufficiently densified and the density of the non-electrode portion becomes 94% or more to 97% or less of that of the electrode portion. It is preferred to determine the baking temperature as described above based on a result of relationships between the baking temperature and the density variation, which are measured in advance using the test piece of the electrode portion of the piezoelectric layer and the test piece of the non-electrode portion.

In addition, a test specimen of the electrode portion E and a test specimen of the non-electrode portion D interposed between two electrode portions E are cut out by a dicer from the laminated piezoelectric element 1 baked at a baking temperature varied from 860 to 960° C., and densities thereof were measured. Then, it was confirmed that the densities were substantially the same as those shown in FIG. 5.

Because of the same density, it is expected that the electromechanical coupling coefficient kr is the same.

Further, because the non-electrode portion has a small density and is not densified, the Young's modulus is low, and binding force against a displacement or a stress generated in the electrode portion becomes small.

Further, as to piezoelectric characteristics of the non-electrode portion D1 interposed between electrode portions having different polarities, because the density is low and the densification is not obtained, piezoelectric characteristics after polarization are inferior to those of the non-electrode portion of the conventional example, and a variation of the Young's modulus due to the polarization is smaller. In other words, sensitivity to the polarization is decreased, and as a result, the Young's modulus of the non-electrode portion does not change largely before and after the polarization.

For instance, in FIG. 5, density of the test piece Tb at 940° C. is substantially the same as density of the test piece Ta at 880° C.

Further, in FIG. 6, there is an apparent difference between the characteristics of the test piece Ta at 940° C. and those at 880° C., and it can be estimated that the piezoelectric characteristics of the test piece Tb at 940° C. are inferior.

This laminated piezoelectric element 1 of the baking temperature of 900 to 940° C. was incorporated in the rod-like vibration wave motor 10, and performance of the motor was measured.

As a result, similar and not inferior motor performance (rotation speed and torque) was obtained compared with the conventional laminated piezoelectric element manufactured using the electrode material containing silver at 70 wt % and palladium at 30 wt % at the baking temperature of 1,150° C.

Further, the influence of anisotropy of mechanical characteristics unnecessary for the vibration wave motor was reduced. Rotation position accuracy of the vibration wave motor was increased, and rotational unevenness thereof was reduced, as a result of actual measurement and evaluation of the rotation position accuracy and the rotational unevenness. Further, it was confirmed that an abrasion state and the like were improved.

As described above, by baking the laminated piezoelectric element at a baking temperature of 900 to 940° C. at which the electrode portion E is baked completely and is densified as in the test piece Ta, the electrode portion E can exert sufficient piezoelectric characteristics even if the non-electrode portion D is not sufficiently densified as in the test piece Tb.

In other words, it is possible to bake at a temperature lower by approximately 20 to 60° C. than the baking temperature at which both the electrode portion E and the non-electrode portion D are densified (temperature difference of the baking temperature is 20 to 60° C.)

In the experiment described above, the electrode material was prepared to contain silver at 95 wt % and palladium at 5 wt %. As a matter of course, there was no problem even if palladium was contained at 5 wt % or more.

In addition, at this baking temperature of 900 to 940° C., because the melting point of silver is approximately 960° C., a good piezoelectric element having an electromechanical coupling coefficient kr of approximately 56.4% was obtained even if silver was contained at 100 wt %.

However, if silver is contained at 100 wt % and the operating environment is very humid, there may occur so-called migration in which silver ions move and form a short circuit. Therefore, it is considered good to add some palladium.

A preferred ratio between silver and palladium at a baking temperature of 940° C. or lower is 100:0 to 95:5 by weight percent.

Note that, strictly speaking, the piezoelectric element of the present invention includes a single piezoelectric layer 2 having a thickness of approximately 90 μm formed on each of the upper and lower sides of the laminated piezoelectric element, and this portion also has the same density as the non-electrode portion D and is not sufficiently densified.

However, it was confirmed that there was no influence to the vibration wave motor including the piezoelectric layers having a thickness of approximately 90 μm on the upper and lower sides even when the piezoelectric element was actually incorporated in the vibration wave motor and driven.

In addition, it was confirmed that the performance is not inferior to the conventional vibration wave motor after environmental test of high temperature and high humidity (80° C. and 90% relative humidity).

In other words, it was confirmed that the piezoelectric layers having a thickness of approximately 90 μm on the upper and lower sides of the laminated piezoelectric element and the non-electrode portion D at the outer peripheral portion functioned sufficiently as electrically insulating layers covering the electrode portion E and as a mechanical protection layer for a long time, and were not inferior to those of the conventional laminated piezoelectric element.

EXAMPLE 2

As Example 2 of the present invention, a structural example of a laminated piezoelectric element 1' according to another form different from Example 1 is described below with reference to FIGS. 7A and 7B.

Figure 7A:
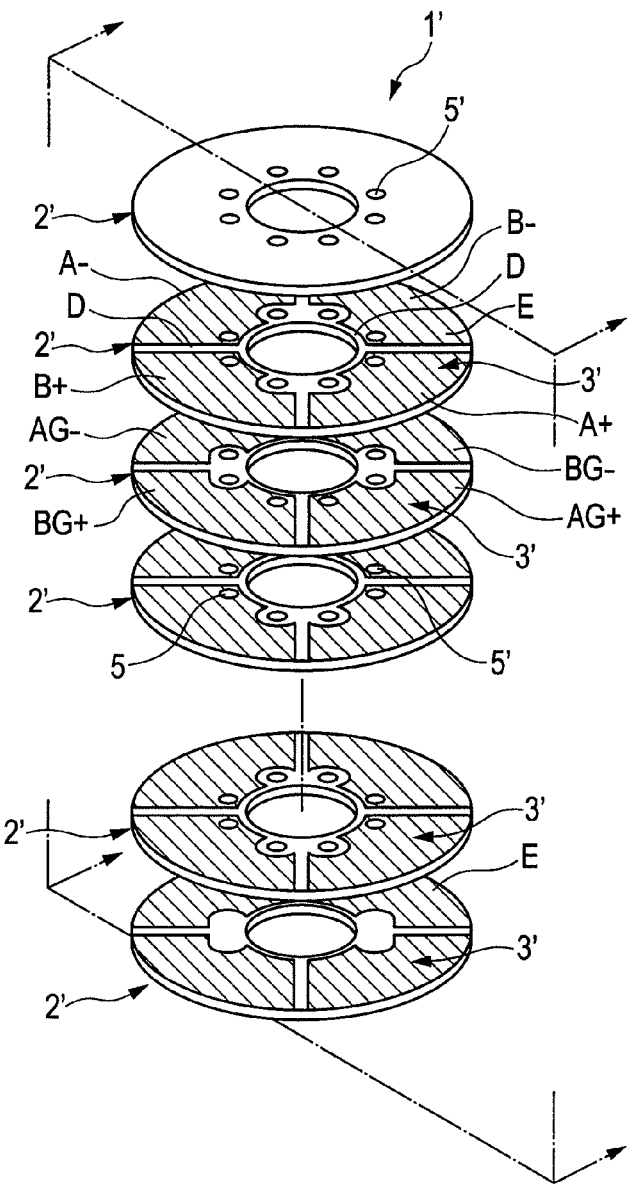
FIGS. 7A and 7B are an exploded perspective view and a cross sectional view, respectively, illustrating a laminated piezoelectric element according to Example 2 of the present invention.
Figure 7B:
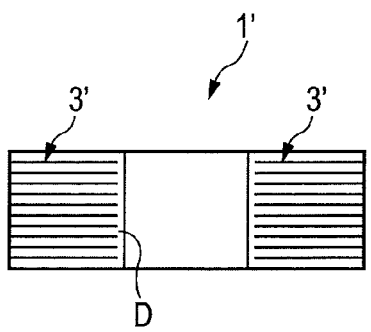

FIG. 7A is an exploded perspective view of the laminated piezoelectric element 1', and FIG. 7B is a cross sectional view taken along the arrow line in FIG. 7A.

The material composition of the piezoelectric material, the manufacturing method therefor, and the baking temperature are the same as those of Example 1. The laminated piezoelectric element 1' is different from the laminated piezoelectric element 1 of Example 1 in two points.

One point is that an electrode layer 3' formed on a piezoelectric layer 2' is exposed to the outer periphery, and there is a non-electrode portion at an inner circumference portion.

The other point is that the electrical connection among electrode layers 3' is obtained using eight through holes 5' filled with conductive material instead of using the external electrodes 4 of the laminated piezoelectric element 1.

Note that, the through holes 5' are integrally baked together with the electrode layer and the piezoelectric layer. The conductive material filled in the through hole 5' also contains silver and palladium similarly to the electrode layer.

The through hole 5' slightly protrudes from the surface of the uppermost piezoelectric layer 2' and contacts with the flexible circuit board 12 so that electrical connection can be obtained therebetween when being incorporated in the vibration body of the vibration wave motor similarly to the laminated piezoelectric element 1 of FIG. 3.

In this example too, the laminated piezoelectric element 1' was baked at a baking temperature of 900 to 940° C., at which the electrode portion E is baked completely and is densified.

As a result, similarly to Example 1, the electrode portion E exerted sufficient piezoelectric characteristics as the laminated piezoelectric element of the vibration wave motor even if the non-electrode portion D was not sufficiently densified.

The piezoelectric element of the present invention described above can be appropriately used for a laminated type piezoelectric actuator or the like including the non-electrode portion in which the electrode layer (internal electrode) is not formed as described in Japanese Patent Application Laid-Open No. 2001-267646, for example, similarly to the present invention.

In the piezoelectric actuator of the present invention, because the non-electrode portion has a smaller Young's modulus than the electrode portion, generation of binding force is less than the electrode portion, and the non-electrode portion has the same property as a stress relieving layer. Therefore, it is possible to suppress cracks in the piezoelectric element.

In addition, according to the structure of the present invention, it is possible to improve rotation position accuracy and rotational unevenness of a vibration wave motor so that an effect such as a long life due to uniform abrasion can be expected.

In addition, it is possible to bake at a lower temperature, and hence it is possible to reduce the used amount of palladium, which is an expensive precious metal.

Further, baking at low temperature reduces electric power consumption and facilitates the management of the baking furnace. Thus, it is possible to provide an inexpensive piezoelectric element by reducing the manufacturing cost.

Further, because the non-electrode portion is not densified, the density and the Young's modulus become smaller than those of the electrode portion, and in addition, because the piezoelectric characteristics are inferior even after the polarization, it is possible to reduce the influence of the non-electrode portion to a displacement and a stress generated in the electrode portion.

Specifically, it is possible to reduce unnecessary binding force of the non-electrode portion between the divided electrode portions and the non-electrode portion at the outer peripheral portion or the inner circumference portion to the electrode portion in the laminated piezoelectric element used for the vibration wave motor.

Similarly, it is possible to suppress a crack at a boundary between the electrode portion and the non-electrode portion, which is apt to occur in the conventional laminated type piezoelectric actuator.

EXAMPLE 3

As described above, the test piece Tb supposing the non-electrode portion of Example 1 illustrated in FIG. 5 is not densified completely until the temperature becomes 960° C. unlike the test piece Ta that is the laminated piezoelectric element. However, even in the single plate piezoelectric ceramics (single layer type piezoelectric ceramics) made of a so-called single piezoelectric layer like the test piece Tb, it is preferred that baking be performed at a lower temperature. Therefore, as Example 3 of the present invention, a method for enabling baking of the single plate piezoelectric ceramics like the test piece Tb at a lower temperature is described below with reference to FIGS. 8A, 8B, and 8C.

Figure 8A:
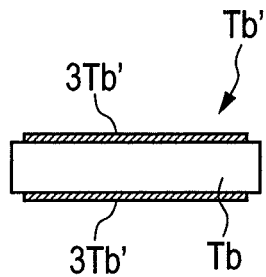
FIGS. 8A, 8B and 8C are diagrams illustrating a single plate piezoelectric ceramics and a piezoelectric element according to Example 3 of the present invention.

FIG. 8A illustrates a test piece Tb' before baking, which includes the test piece Tb of Example 1 and electrodes 3Tb' that are electrode layers formed by printing and applying the electrode material paste containing silver at 95 wt % and palladium at 5 wt % used in Example 1 onto the surfaces (upper and lower surfaces).

When this test piece Tb' is baked, the silver element in the electrode 3Tb' is dispersed into the piezoelectric ceramics, and hence sintering of the piezoelectric ceramics can be promoted similarly to Example 1 owing to the effect of the copper oxide that is the low temperature sintering additive contained in the piezoelectric material.

In this way, in baking of the single plate piezoelectric ceramics too, the electrode layer containing a silver element is formed in advance so that the silver element can be dispersed, and hence the dispersion of the silver element is promoted so that the baking can be performed at a lower temperature.

However, unlike the test piece Ta of Example 1 illustrated in FIG. 5, the test piece Tb' was not densified at a baking temperature of 900° C. kept for 2 hours, but was densified at a baking temperature of 935 to 945° C.

This is because the test piece Tb' has a single plate shape with a thickness of 1.0 mm in a state where the electrodes 3Tb' are printed on the surfaces and is different in the dispersed state of the silver element into the piezoelectric layer in baking, compared with the test piece Ta made of the nine piezoelectric layers 2Ta having a thickness of 90 µm each and the electrode layers 3Ta having a thickness of approximately 2 to 3 µm sandwiching the piezoelectric layer 2Ta.

The baked test piece Tb' may be used as it is as the piezoelectric element with the electrodes 3Tb', but usually there occurs a deformation of the piezoelectric ceramics or unevenness on the surface thereof in the simply baked state.

Figure 8B:
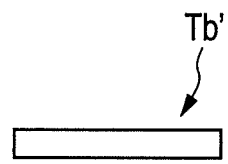
Figure 8C:
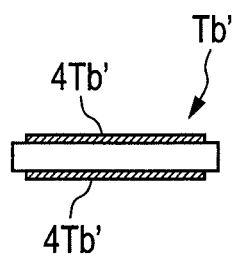
Figure 9:
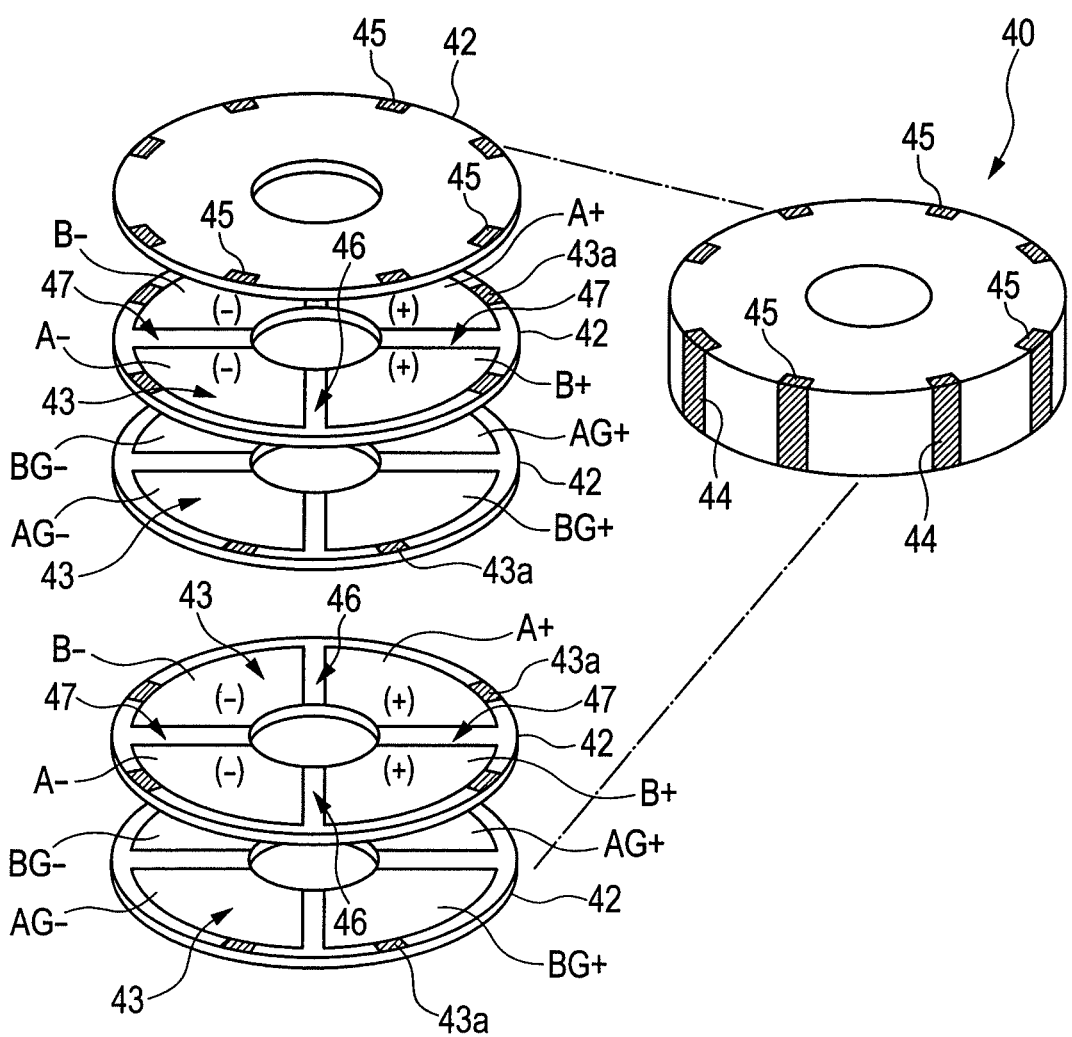
FIG. 9 is an exploded perspective view and a perspective view of a structure of a laminated piezoelectric element according to a conventional example.
Figure 10:
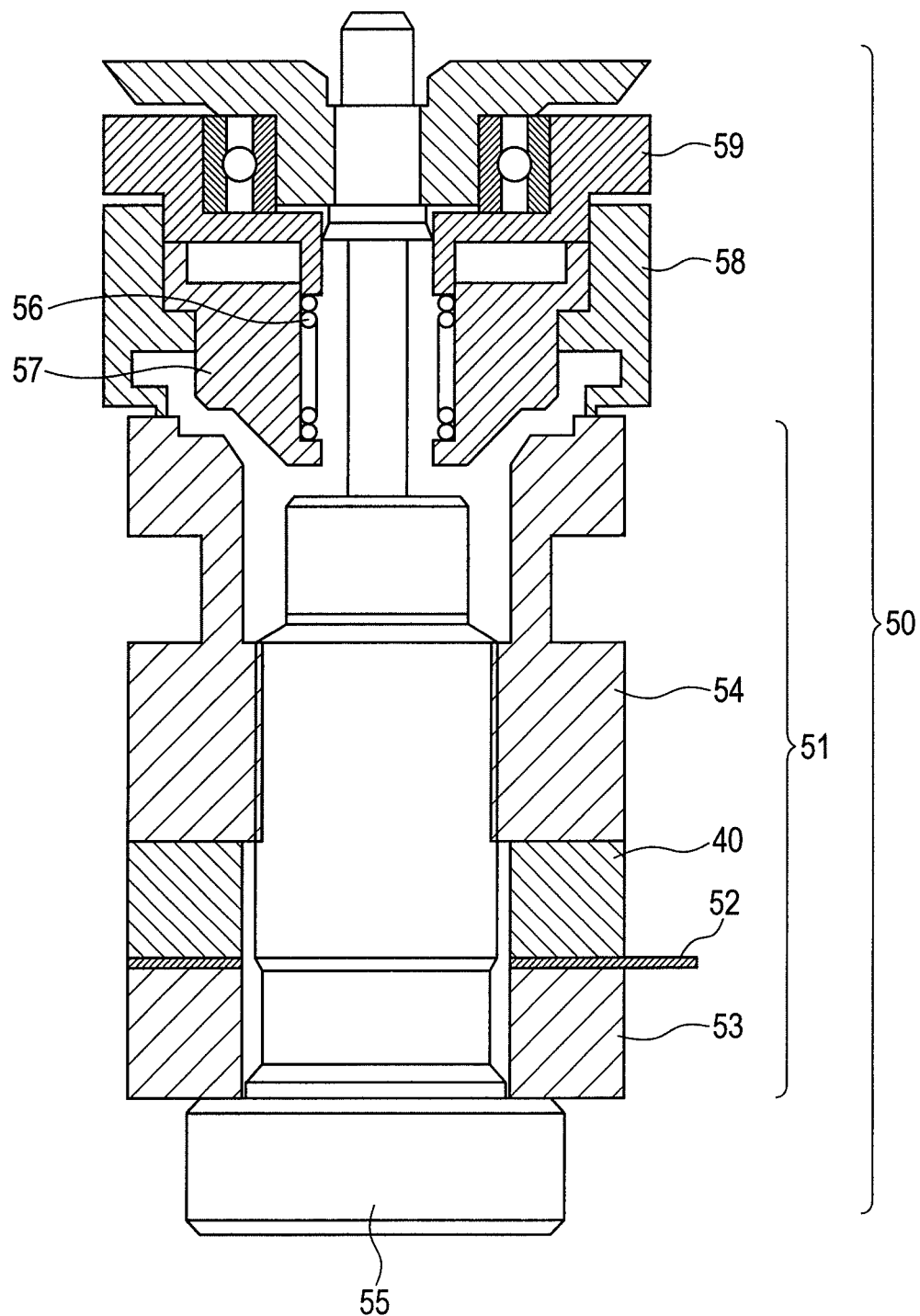
FIG. 10 is a diagram illustrating a structure of a vibration wave motor in which the laminated piezoelectric element of the conventional example is incorporated.

Therefore, as illustrated in FIG. 8B, lapping was performed on both sides of the test piece Tb' after baking, and the electrodes 3Tb' printed and applied onto the surfaces and the piezoelectric ceramics in the vicinity thereof were ground to be smoothed so that the thickness became 0.9 to 0.5 mm. After that, electrodes 4Tb' were formed as illustrated in FIG. 8C, and thus the piezoelectric element was obtained.

The electrode 4Tb' was formed in the same manner as the external electrode 4Ta of Example 1, by applying the silver paste containing glass frit and performing baking at a temperature of approximately 750° C.

Then, one of two electrodes 4Tb' was connected to the ground while a voltage of 1.5 kV was applied to the other electrode in oil at a temperature of 120° C. for approximately 30 minutes to perform the polarization.

As a result, the electromechanical coupling coefficient kr of the test piece Tb' as the piezoelectric element became 55.2%. When the thickness of the single plate piezoelectric ceramics, the baking temperature, or the keeping time of the baking temperature is changed, the density or the electromechanical coupling coefficient changes.

Further, in baking of the single plate piezoelectric ceramics, when an outer shape (pattern) of the electrode including the silver electrode, which enables dispersion of silver element, is changed, it is possible to form a densified region having an arbitrary outer shape on the piezoelectric ceramics plate.

In other words, this means that the electrode layer divided into four regions as exemplified by the electrode layers 3 of the laminated piezoelectric element 1 of Example 1 and the non-electrode portions 6 and 7 having the density different from that of the electrode layer interposed between the electrode layers 3 can be formed on the single plate piezoelectric ceramics, too.

As described above, according to the present invention, not only the piezoelectric element but also the single plate piezoelectric ceramics of a single layer type having one piezoelectric layer and two electrode layers can be baked at a lower temperature, and the region having a small density can be disposed on the single plate piezoelectric ceramics, too.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-052510, filed Mar. 10, 2011, which is hereby incorporated by reference herein in its entirety.

What is claimed is:

1. A piezoelectric element, comprising:
    an electrode portion comprising a piezoelectric layer and an electrode layer that are laminated; and
    a non-electrode portion that is in contact with the electrode portion and comprises a piezoelectric layer without an electrode layer,
    wherein the non-electrode portion includes a region where a density of a piezoelectric material in the piezoelectric layer in the region is smaller than a density of a piezoelectric material in the piezoelectric layer of the electrode portion.

2. The piezoelectric element according to claim 1, wherein the piezoelectric layer includes a low temperature sintering additive, and the electrode layer contains a silver element.

3. The piezoelectric element according to claim 2, wherein the low temperature sintering additive contains a copper element.

4. The piezoelectric element according to claim 1, which is formed by baking at a baking temperature of 940° C. or lower.

5. The piezoelectric element according to claim 1, wherein the density of the piezoelectric material in the region of the non-electrode portion is 94% or more to 97% or less of the density of the piezoelectric material in the electrode portion.

6. The piezoelectric element according to claim 1, wherein the non-electrode portion is interposed between two neighboring electrode portions having different polarities.

7. A piezoelectric actuator, comprising the piezoelectric element according to claim 1.

8. A vibration wave motor, comprising:
    the piezoelectric element according to claim 1; and
    a vibration body,
    wherein the piezoelectric element drives the vibration body.

* * * * *